(12) United States Patent
Kuba et al.

(10) Patent No.: US 7,755,577 B2
(45) Date of Patent: Jul. 13, 2010

(54) ELECTROLUMINESCENT DEVICE

(75) Inventors: Yutaka Kuba, Shiga (JP); Shinichi Abe, Shiga (JP)

(73) Assignee: Kyocera Corporation, Kyoto (JP)

( * ) Notice: Subject to any disclaimer, the term of this patent is extended or adjusted under 35 U.S.C. 154(b) by 961 days.

(21) Appl. No.: 11/534,853

(22) Filed: Sep. 25, 2006

(65) Prior Publication Data

US 2007/0069996 A1    Mar. 29, 2007

(30) Foreign Application Priority Data

Sep. 26, 2005   (JP)   ............................. 2005-278157

(51) Int. Cl.
*G09G 3/30*   (2006.01)
(52) U.S. Cl. ............................. 345/76; 349/69; 313/498
(58) Field of Classification Search .................. 345/76, 345/82–84; 349/69; 313/498, 500–512; 315/169.3; 257/88, 89; 428/690
See application file for complete search history.

(56) References Cited

U.S. PATENT DOCUMENTS

| | | | | |
|---|---|---|---|---|
| 5,055,739 A | * | 10/1991 | Thioulouse | ................. 313/507 |
| 6,455,176 B2 | * | 9/2002 | Eida et al. | .................... 428/690 |
| 6,831,409 B2 | | 12/2004 | Yamada | |
| 7,173,369 B2 | * | 2/2007 | Forrest et al. | ................ 313/503 |
| 7,623,199 B2 | * | 11/2009 | Domoto | ........................ 349/69 |

FOREIGN PATENT DOCUMENTS

JP         3508741        12/2002

* cited by examiner

*Primary Examiner*—Regina Liang
(74) *Attorney, Agent, or Firm*—Volpe and Koenig, PC

(57) ABSTRACT

An electroluminescent device includes a first optical output part having a light-emitting layer emitting a light ray of a first color, a second optical output part having a light-emitting layer emitting a light ray of a second color, and a third optical output part having a light-emitting layer emitting a light ray of a third color, the colors being different from one another. Each of the optical output parts also has a resonator structure that resonates the light ray emitted from the light-emitting layer. In each optical output part, a resonant peak wavelength indicating a peak value of a transmission spectrum of light transmitted through the resonator structure in a direction perpendicular to a main surface of the light-emitting layer is on a longer or shorter wavelength side of an emission peak wavelength indicating a peak value of an emission spectrum of the light ray emitted by the light-emitting layer.

18 Claims, 11 Drawing Sheets

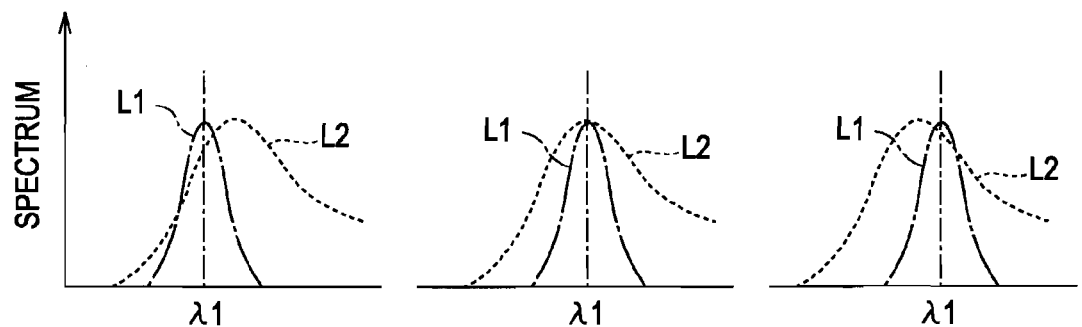
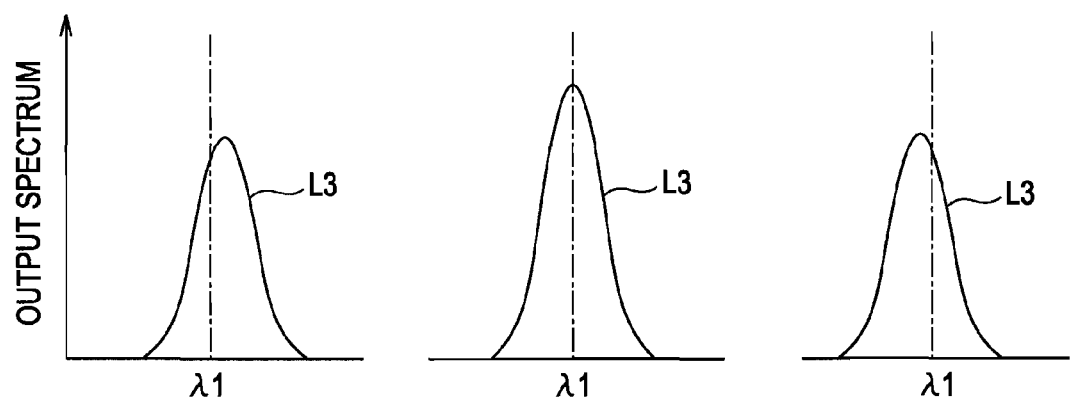

ELECTROLUMINESCENT DEVICE

CROSS-REFERENCE TO RELATED APPLICATIONS

The present application claims priority under 35 U.S.C. §119 to Japanese Patent Application No. 2005-278157, filed Sep. 26, 2005, entitled "ELECTROLUMINESCENT DEVICE." The contents of this application are incorporated herein by reference in their entirety.

BACKGROUND OF THE INVENTION

1. Field of the Invention

The present invention relates to electroluminescent devices that perform multicolor light emission.

2. Description of the Related Art

Generally, an electroluminescent device has a plurality of optical output parts, each including a light-emitting layer and a resonator structure that resonates light emitted from the light-emitting layer. The resonator structure includes, for example, electrodes having the light-emitting layer interposed therebetween, and other layers and components through which the light is transmitted. A resonant wavelength of the light resonated by the resonator structure changes in accordance with an output angle of the light output from the electroluminescent device. Thus, the intensity of the light output from the electroluminescent device changes in accordance with the output angle of the light.

In this respect, in a conventional electroluminescent device that performs multicolor light emission, there is no sufficient means for adjusting the relationships between the wavelengths of red, green, and blue light rays emitted by the light-emitting layers of the corresponding optical output parts, which constitute pixels of these colors, and the resonant wavelengths of the resonator structures in the corresponding optical output parts.

Thus, in such a conventional electroluminescent device, the intensity ratio among the red, green, and blue light rays output from the corresponding optical output parts constituting the pixels of these colors fluctuates significantly in accordance with the output angle of the light rays, thus leading to color shifts in which the luminescent colors vary depending on the output angle (viewing direction).

Accordingly, it is an object of the present invention to provide an electroluminescent device that can suppress the occurrence of color shifts in the luminescent colors when the viewing direction changes.

SUMMARY OF THE INVENTION

An electroluminescent device according to one aspect of the present invention includes a first optical output part including a light-emitting layer that emits a light ray of a first color and a resonator structure that resonates the light ray of the first color emitted from the light-emitting layer; a second optical output part including a light-emitting layer that emits a light ray of a second color and a resonator structure that resonates the light ray of the second color emitted from the light-emitting layer; and a third optical output part including a light-emitting layer that emits a light ray of a third color and a resonator structure that resonates the light ray of the third color emitted from the light-emitting layer. The first, second, and third colors are different from one another. In each of the first to third optical output parts, when a peak value of a transmission spectrum of light transmitted through the resonator structure in a direction perpendicular to a main surface of the light-emitting layer is defined as a resonant peak wavelength, the resonant peak wavelength is on a longer wavelength side of an emission peak wavelength indicating a peak value of an emission spectrum of the light ray emitted by the light-emitting layer.

An electroluminescent device according to another aspect of the present invention includes a first optical output part including a light-emitting layer that emits a light ray of a first color and a resonator structure that resonates the light ray of the first color emitted from the light-emitting layer; a second optical output part including a light-emitting layer that emits a light ray of a second color and a resonator structure that resonates the light ray of the second color emitted from the light-emitting layer; and a third optical output part including a light-emitting layer that emits a light ray of a third color and a resonator structure that resonates the light ray of the third color emitted from the light-emitting layer. The first, second, and third colors are different from one another. In each of the first to third optical output parts, when a peak value of a transmission spectrum of light transmitted through the resonator structure in a direction perpendicular to a main surface of the light-emitting layer is defined as a resonant peak wavelength, the resonant peak wavelength is on a shorter wavelength side of an emission peak wavelength indicating a peak value of an emission spectrum of the light ray emitted by the light-emitting layer.

BRIEF DESCRIPTION OF THE DRAWINGS

FIGS. 5A to 5C illustrate changes in the relationship between the emission spectrum and the transmission spectrum in accordance with various output angles;

FIGS. 6A to 6C illustrate output spectra corresponding to the conditions shown in FIGS. 5A to 5C, respectively;

DESCRIPTION OF THE PREFERRED EMBODIMENTS

First Embodiment

Principle of How Color Shifts Occur

Before describing embodiments of the present invention below, the principle of how color shifts occur will be described first.

Figure 1A:
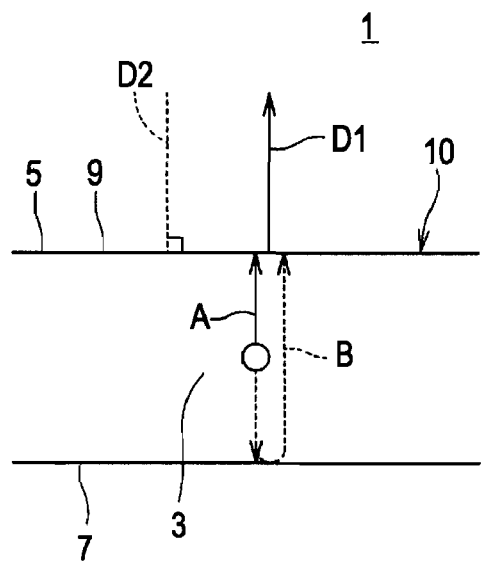
FIGS. 1A and 1B illustrate a relationship between characteristics of a resonator structure included in an electroluminescent device and a light output direction.
Figure 1B:
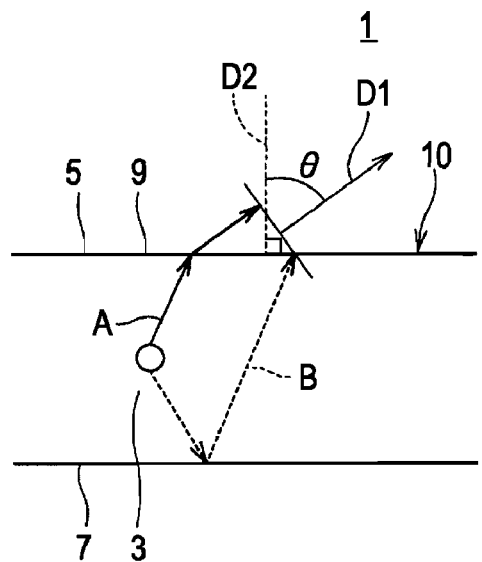

FIGS. 1A and 1B illustrate a relationship between characteristics of a resonator structure included in an electroluminescent device and a light output direction.

Referring to FIGS. 1A and 1B, an electroluminescent device 1 has an optical output part 10 including an organic layer 3. The organic layer 3 includes a light-emitting layer that produces electroluminescence, and has opposite surfaces that function as reflective surfaces 5, 7 defined by, for example, electrodes. The reflective surfaces 5, 7 constitute a resonator structure 9. Thus, light output towards a viewer from the electroluminescent device 1 is a combination of a light component emitted by the organic layer 3 and transmitted through the reflective surface 5 without being reflected by the reflective surfaces 5, 7, and a light component emitted by the organic layer 3 and transmitted through the reflective surface 5 after being reflected one or more times by the reflective surfaces 5, 7. Each of the reflective surfaces 5, 7 is an interface at which the refractive index changes significantly. For example, each of the reflective surfaces 5, 7 may be defined by an electrode, or may be a surface of an adjustment layer for adjusting light transmission characteristics, a surface of a sealing film for sealing the organic layer 3, or a surface of a glass substrate (i.e. transparent substrate). On the other hand, the optical output part 10 comprises the organic layer 3 that emits light and the resonator structure 9 provided on an optical path of the light emitted from the organic layer 3.

As shown in FIGS. 1A and 1B, the resonator structure 9 has characteristics in which the optical path of the light combined in and released from the resonator structure 9 varies depending on an output direction D1 of light to be output from the electroluminescent device 1 and a resonant wavelength changes in accordance with the optical path. In other words, FIGS. 1A and 1B show an optical path A in which light is not reflected and an optical path B in which light is reflected once when the light output direction D1 changes. FIG. 1A corresponds to a case where the light output direction D1 is parallel to a front direction D2, which is perpendicular to an emission plane of the electroluminescent device 1. FIG. 1B corresponds to a case where the light output direction D1 is slanted with respect to the front direction D2. An optical-path difference between the optical paths A and B is reduced as an output angle θ increases, whereby the resonant wavelength shifts towards a shorter wavelength side in response to the increase in the output angle θ. Accordingly, a transmission spectrum, which is obtained when the light emitted from the organic layer 3 passes through the resonator structure 9, changes from a state indicated by a solid line in FIG. 2 to a state indicated by a dotted line as the output angle θ increases. In this case, the term "output angle θ" refers to a slanted angle of the light output direction D1 with respect to the front direction D2.

Figure 2:
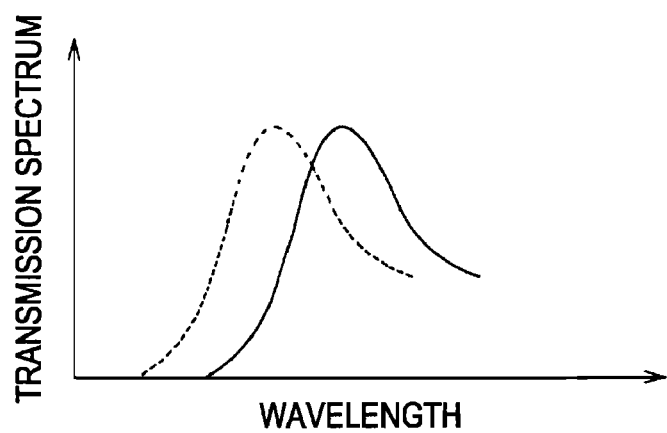
FIG. 2 illustrates a transmission spectrum of the resonator structure.

The ordinate axis in the graph shown in FIG. 2 corresponds to a proportion of the light emitted from the organic layer 3 that is transmitted through the resonator structure 9 (i.e. light transmittance) before being output outward. In each of graphs related to transmission spectra hereinafter, the ordinate axis will represent the light transmittance. On the other hand, in each of graphs related to emission spectra and output spectra hereinafter, the ordinate axis will represent the light intensity.

Figure 3:
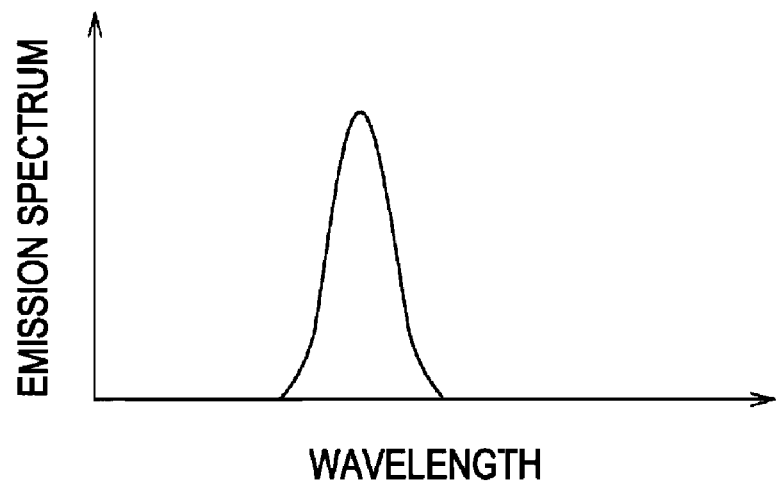
FIG. 3 illustrates an emission spectrum of an organic layer.

An emission spectrum of light emitted by the organic layer 3 is determined on the basis of material characteristics of the organic layer 3, and has, for example, a pattern shown in FIG. 3. The emission spectrum is fixed regardless of the output angle θ of light output in the light output direction D1.

Figure 4:
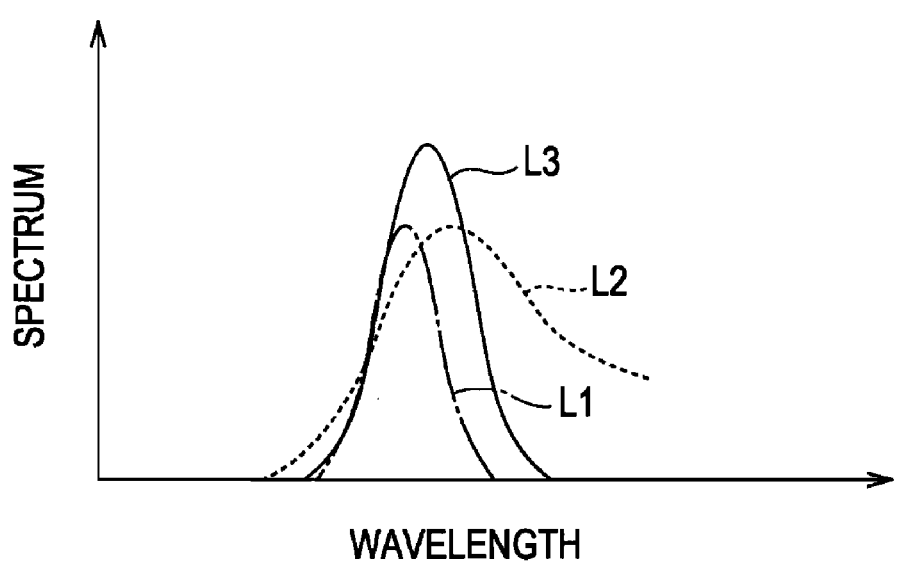
FIG. 4 illustrates relationships among an emission spectrum of the organic layer, a transmission spectrum of the resonator structure, and an output spectrum of output light.

FIG. 4 illustrates relationships among an emission spectrum of light emitted by the organic layer 3, a transmission spectrum indicating a proportion of the light emitted from the organic layer 3 that is output outward via the resonator structure 9, and an output spectrum of light that is actually output from the electroluminescent device 1. Specifically, a curve L1 represents the emission spectrum, a curve L2 represents the transmission spectrum, and a curve L3 represents the output spectrum. The transmission spectrum (L2) and the output spectrum (L3) shown in FIG. 4 correspond to a case where the output angle θ of light output in the light output direction D1 is 0°. As shown in FIG. 4, the output spectrum (L3) is determined from a product of the emission spectrum (L1) and the transmission spectrum (L2).

As mentioned above, although the emission spectrum (L1) is not dependant on the output angle θ, the transmission spectrum (L2) is dependant on the output angle θ. Therefore, the relationship between the emission spectrum (L1) and the transmission spectrum (L2) varies in accordance with the output angle θ, and the output spectrum (L3) changes in accordance with that relationship.

FIGS. 5A to 5C illustrate changes in the relationship between the emission spectrum and the transmission spectrum in accordance with various output angles. FIGS. 6A to 6C illustrate output spectra corresponding to the conditions shown in FIGS. 5A to 5C, respectively. More specifically, the spectra shown in FIGS. 5A and 6A correspond to a case where the output angle θ is 0°. The spectra shown in FIGS. 5B and 6B correspond to a case where the output angle θ is C1 (0°<C1<90°). The spectra shown in FIGS. 5C and 6C correspond to a case where the output angle θ is C2 (0°<C2<90°, C2>C1). Reference numeral λ1 in FIGS. 5A to 5C indicates an emission wavelength at which the emission spectrum (L1) reaches a peak value.

If the electroluminescent device 1 is a type that performs multicolor light emission, first to third optical output parts 10 are provided for outputting red, green, and blue light rays, respectively. Thus, if the variation characteristics of the transmission spectra in accordance with the output angle θ are different among the optical output parts 10 corresponding to these different colors, color shifts may occur among the luminescent colors when the output angle θ changes.

Figure 7A:
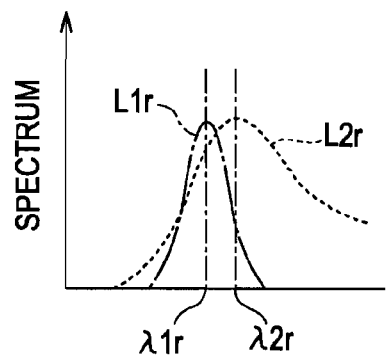
FIGS. 7A to 7C illustrate relationships between emission spectra and transmission spectra of first to third optical output parts included in a typical electroluminescent device.
Figure 7B:
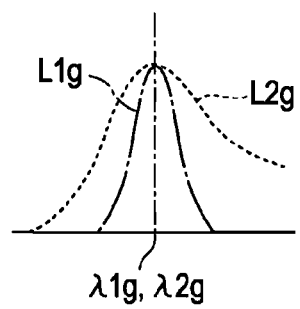
Figure 7C:
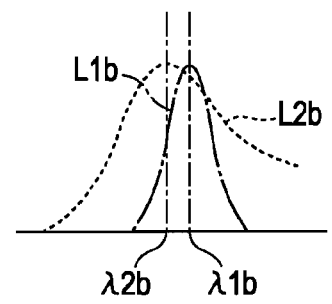

FIGS. 7A to 7C illustrate relationships between emission spectra and transmission spectra of first to third optical output parts included in a typical electroluminescent device.

Referring to FIG. 7A, a wavelength λ2r at which a transmission spectrum L2r of the first optical output part 10 corresponding to red color reaches a peak value is on the longer wavelength side of a wavelength λ1r at which an emission spectrum L1r of the first optical output part 10 reaches a peak value. A wavelength at which a transmission spectrum reaches a peak value will be referred to as "resonant peak wavelength" hereinafter, and moreover, a wavelength at which an emission spectrum reaches a peak value will be referred to as "emission peak wavelength" hereinafter. Furthermore, referring to FIG. 7B, a resonant peak wavelength λ2g at which a transmission spectrum L2g of the second optical output part 10 corresponding to green color reaches a peak value is substantially equal to an emission peak wavelength λ1g of an emission spectrum L1g of the second optical output part 10. Furthermore, referring to FIG. 7C, a resonant peak wavelength λ2b of a transmission spectrum L2b of the third optical output part 10 corresponding to blue color is on the shorter wavelength side of an emission peak wavelength λ1b of an emission spectrum L1b obtained from the third optical output part 10.

Consequently, in this typical electroluminescent device, when the output angle θ changes, the resonant peak wavelengths λ2r, λ2g, λ2b of the first to third optical output parts 10 change disorderly with respect to the emission peak wavelengths λ1r, λ1g, λ1b. This causes the ratio of output intensities (i.e. peak values of output spectra) among the color light rays to vary significantly.

Figure 8:
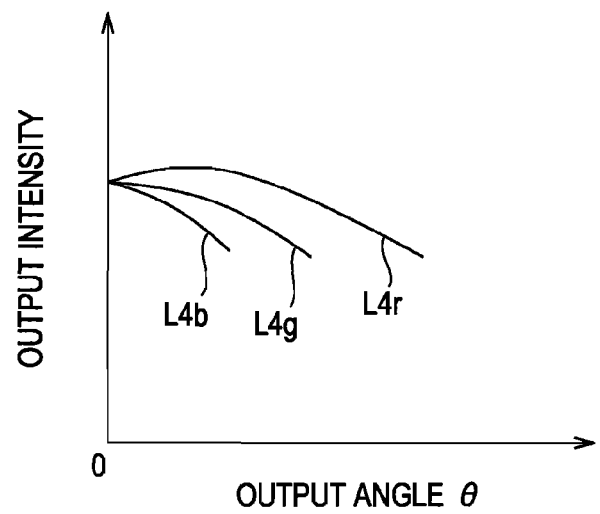
FIG. 8 illustrates relationships between the output angle and output intensities of red, green, and blue light rays in a case where the example corresponding to FIGS. 7A to 7C is adopted.

FIG. 8 illustrates relationships between the output angle and the output intensities of red, green, and blue light rays in a case where the example corresponding to FIGS. 7A to 7C is adopted. Curves L4r, L4g, L4b shown in FIG. 8 represent relationships between the output angle θ and the output intensities of the color light rays that are actually output from the first to third optical output parts 10. The output intensity of each color is normalized such that a value corresponding output angle θ=0° is set as a reference value.

Referring to FIG. 8, the ratio of the output intensities among the color light rays changes significantly in accordance with a value of the output angle θ. Therefore, if the luminescent colors of the electroluminescent device are supposedly set with using the output angle θ=0° as a standard, the luminescent colors are subject to shifting as the output angle θ increases.

In detail, as the output angle θ increases from 0°, the output intensity of the red color increases, whereas the output intensities of the green and blue colors decrease. Consequently, even when white light is output with using the front direction D2 as a standard, since the ratio of the red light component is relatively increased, the light will appear to be somewhat reddish when the electroluminescent device is viewed from an angle.

The present inventors have invented means for reducing color shifts, which is achieved by adjusting the relationships between emission spectra (L1r, L1g, L1b) and transmission spectra (L2r, L2g, L2b) of the first to third optical output parts in an electroluminescent device.

Configuration of Electroluminescent Device

Figure 9:
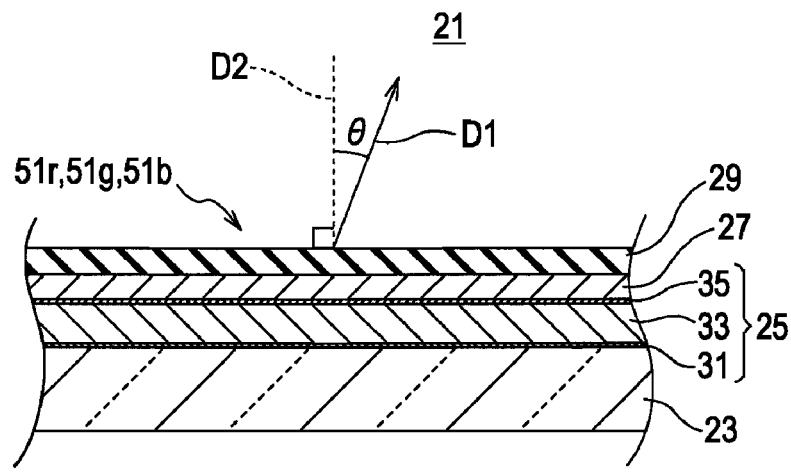
FIG. 9 is a schematic cross-sectional view illustrating an electroluminescent device according to a first embodiment of the present invention.

FIG. 9 is a schematic cross-sectional view illustrating an electroluminescent device 21 according to a first embodiment of the present invention. The electroluminescent device 21 is a top emission type and includes a glass substrate 23 serving as a transparent substrate, element portions 25 disposed on the glass substrate 23, adjustment layers 27 disposed on the element portions 25, and a sealing film 29 extending from the top of the adjustment layers 27 to entirely cover the element portions 25. Each of the element portions 25 includes a first electrode 31, an organic layer 33, and a second electrode 35 disposed in that order from the glass substrate 23. Thus, the organic layer 33 is interposed between the first electrode 31 and the second electrode 35.

Figure 10:
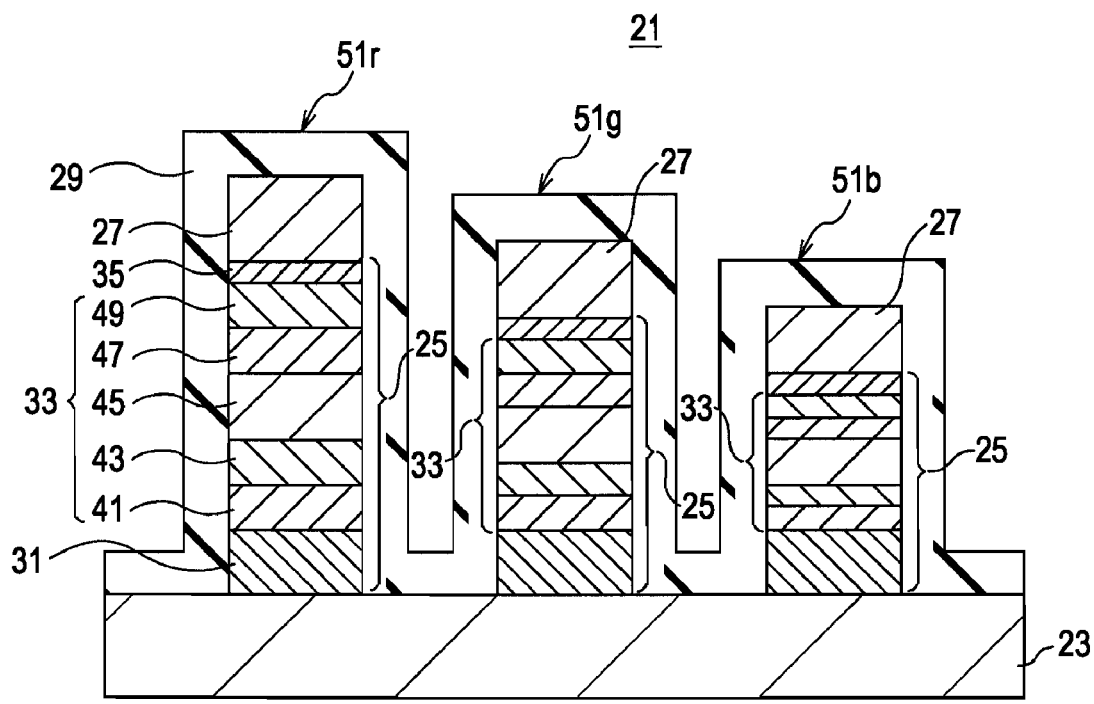
FIG. 10 is a schematic cross-sectional view illustrating first to third optical output parts included in the electroluminescent device shown in FIG. 9.

Referring to FIG. 10, in order to perform multicolor light emission, the electroluminescent device 21 is provided with first to third optical output parts 51r, 51g, 51b in correspondence to red, green, and blue colors, respectively. In this case, each of the optical output parts 51r, 51g, 51b comprises the organic layer 33 that emits light and the abovementioned resonator structure 9 (see FIGS. 1A and 1B) disposed on an optical path of the light emitted from the organic layer 33. A detailed example and characteristics of the resonator structure 9 are as described above.

The organic layers 33 in the first to third optical output parts 51r, 51g, 51b are composed of appropriate materials for producing light rays of red, green, blue wavelengths, respectively.

The adjustment layers 27 are provided for adjusting the light transmission characteristics of the first to third optical output parts 51r, 51g, 51b. Each adjustment layer 27 is given a predetermined optical thickness (nd) that allows the transmission spectrum of light traveling through the corresponding optical output part 51r, 51g, 51b to be large. Alternatively, there may be a case where the adjustment layers 27 are omitted from the first to third optical output parts 51r, 51g, 51b. The adjustment layers 27 may be formed by, for example, vapor deposition. Therefore, by using, for example, a metal mask, the adjustment layers 27 can be formed individually for the corresponding optical output parts 51r, 51g, 51b. As a suitable material used for forming the adjustment layers 27, transparent organic materials, such as styrylarylene and polysilane, or transparent inorganic materials, such as titanium oxide and zinc sulfide, for example, are known. In particular, the organic materials are advantageous in requiring a lower temperature for vapor deposition, which means that the element portions 25 receive less damage from an increased temperature of the glass substrate 23. In addition, due to requiring a lower temperature for vapor deposition, the organic materials allow for less deformation of the metal mask when the temperature of the metal mask is increased, thereby preventing pattern blurring from occurring. Furthermore, in FIG. 9, since the adjustment layer 27 of each optical output part is disposed in contact with the second electrode 35, the adjustment layer 27 can be formed in the same chamber or the same vacuum used when forming the organic layer 33 and the second electrode 35. Accordingly, this allows for a reduction in the size of a manufacturing apparatus, and contributes to an improved tact time for the manufacturing process.

The sealing film 29 is provided for sealing the organic layers 33, the second electrodes 35, and the like, and is disposed so as to completely cover the region in which the element portions 25 of the electroluminescent device 21 are provided. The sealing film 29 is composed of an insulating material having optical transparency, such as SiNx, and commonly covers the optical output parts 51r, 51g, 51b.

The structure of each element portion 25 will now be described. The first electrode 31 reflects at least a portion of the light emitted by the organic layer 33 back towards the organic layer 33, and may be composed of a transparent, semitransparent, or nontransparent electrode material. In order to increase the light reflectance, however, the first electrode 31 is preferably a semitransparent electrode or a nontransparent electrode. More preferably, the first electrode 31 is a reflective electrode composed of, for example, Al. The second electrode 35 may be composed of any type of conductive material that transmits light. In order to increase the light transmittance, however, the second electrode 35 is preferably a semitransparent electrode or a transparent electrode. If a nontransparent electrode material is used, the material has high electrical conductivity and optical characteristics for blocking most of visible light. If a transparent electrode material is used, the material may have relatively high electrical conductivity and optical characteristics for transmitting a large portion of visible light. If a semitransparent electrode material is used, the material may have intermediate characteristics between those of transparent and nontransparent electrode materials. Therefore, if a semitransparent electrode material is used, the electrode will require optical characteristics for transmitting visible light. This may be achieved by reducing the thickness of the electrode.

A suitable material for a transparent electrode is, for example, ITO or IZO. In this case, the transparent electrode preferably has a thickness of 50 nm or more, and more preferably, has a thickness within a range of 100 nm to 300 nm. A suitable material for a nontransparent electrode is, for example, Al. In this case, the nontransparent electrode preferably has a thickness within a range of 100 to 300 nm. A suitable material for a semitransparent electrode is, for example, an alkaline metal such as Li, an alkaline earth metal such as Mg, Ca, Sr, and Ba, or other materials such as Al, Si, and Ag. In this case, the semitransparent electrode preferably has a thickness of less than 100 nm, and more preferably, has a thickness within a range of 5 nm to 50 nm.

Referring to FIG. 10, each organic layer 33 includes a charge injection layer 41 for performing hole or electron injection, a charge transport layer 43 for performing hole or electron transport, a light-emitting layer 45 for producing electroluminescence, a charge transport layer 47 for performing electron or hole transport, and a charge injection layer 49 for performing electron or hole injection. These layers are disposed in the above order from the glass substrate 23. Although at least a portion of each organic layer 33 is composed of an organic material in the first embodiment, at least one of the layers 41, 43, 45, 47, and 49 in the organic layer 33 may be composed of an inorganic material. Alternatively, all of the layers 41, 43, 45, 47, and 49 may be composed of an inorganic material.

Furthermore, although each organic layer 33 in the first embodiment has a five-layer structure, the layer structure of each organic layer 33 may be arbitrarily determined in accordance with various conditions. In other words, the layer structure may be, for example, one of a two-layer to four-layer structures, or a single-layer structure having only the light-emitting layer 45. For example, the structure and material of each organic layer 33 are determined in accordance with the reflective characteristics (nontransparent, semitransparent, or transparent characteristics) and the polarity (for example, anode or cathode) of the first electrode 31 and the second electrode 35, and also in accordance with the type of luminescent color (red, green, or blue) to be emitted by the organic layer 33. In detail, for example, a material such as an $Alq_3$ emits green light as well as having high electron transportability. Therefore, the element portion 25 for emitting green light may have its light-emitting layer and electron transport layers formed of a single material, such as $Alq_3$. Furthermore, when transparent electrodes are used, the electron injection layers are generally formed of metal. The first electrodes 31, the second electrodes 35, and the organic layers 33 are formed by a commonly known thin-film formation technique, such as vapor deposition. On the other hand, the sealing film 29 is also formed by a commonly known thin-film formation technique, such as chemical vapor deposition (CVD) and vapor deposition.

Color Shift Prevention

Figure 11A:
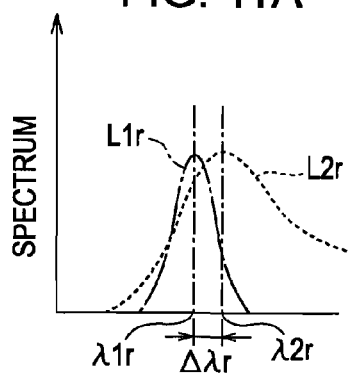
FIGS. 11A to 11C illustrate relationships between emission spectra and transmission spectra of the first to third optical output parts shown in FIG. 10.
Figure 11B:
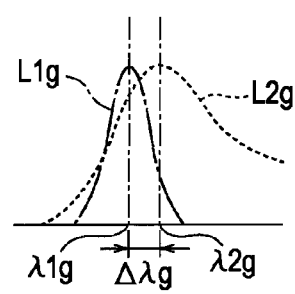
Figure 11C:
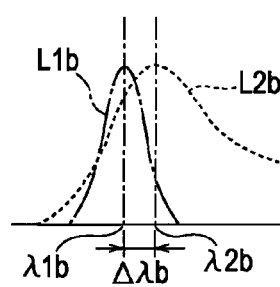

Means for reducing color shifts in the electroluminescent device 21 according to the first embodiment will now be described. FIGS. 11A to 11C illustrate relationships between emission spectra and transmission spectra of the first to third optical output parts 51r, 51g, 51b included in the electroluminescent device 21 according to the first embodiment.

As shown in FIGS. 11A to 11C, in the first embodiment, the transmission spectra of the three colors of light rays transmitted through the corresponding resonator structures 9 of the first to third optical output parts 51r, 51g, 51b in the front direction D2 have resonant peak wavelengths $\lambda 2r, \lambda 2g, \lambda 2b$, respectively, which are all set on the longer wavelength side of the emission peak wavelengths $\lambda 1r, \lambda 1g, \lambda 1b$ in the emission spectra of the three colors of light rays emitted by the corresponding organic layers 33 of the optical output parts 51r, 51g, 51b. The resonant peak wavelengths $\lambda 2r, \lambda 2g, \lambda 2b$ are within the visible light range.

Consequently, in the electroluminescent device 21, when the output angle θ changes, the resonant peak wavelengths $\lambda 2r, \lambda 2g, \lambda 2b$ of the first to third optical output parts 51r, 51g, 51b change in substantially the same pattern with respect to the emission peak wavelengths $\lambda 1r, \lambda 1g, \lambda 1b$. Thus, the output intensities of the light rays of red, green, and blue colors change all together as the output angle θ increases. Accordingly, the ratio of the output intensities among the color light rays is maintained substantially constant even when the output angle θ increases.

Elements constituting the resonator structures 9, which will be referred to as "resonator-structure elements" hereinafter, basically may include any layers and components that are within a region through which light passes. In detail, in a case where the electroluminescent device 21 is a top emission type, the light emitted from the light-emitting layers 45 are transmitted through the sealing film 29 before being eventually output outward. Therefore, the resonator-structure elements include, for example, the layers interposed between the electrodes 31 and 35, the adjustment layers 27, and the sealing film 29. In other words, the resonator structures 9 are a combination of these elements. In this case, the resonator-structure elements that are interposed between the electrodes 31 and 35 have the most significant effect on the characteristics of the entire resonator structure 9.

The resonant peak wavelengths $\lambda 2r, \lambda 2g, \lambda 2b$ of the transmission spectra of the light rays emitted from the optical output parts 51r, 51g, 51b are adjusted by, for example, adjusting the optical thickness nd of the layers (n being a refractive index of each layer and d being the layer thickness thereof) included in the resonator structures 9 with respect to the emission peak wavelengths $\lambda 1r, \lambda 1g, \lambda 1b$ of the emission spectra of the light rays emitted by the optical output parts 51r, 51g, 51b. The optical thickness adjustment is implemented by adjusting the thickness and the material of each layer. When the optical thickness (nd) of each resonator structure 9 is increased, the corresponding resonant peak wavelength shifts towards the longer wavelength side. In contrast, when the optical thickness (nd) of each resonator structure 9 is reduced, the corresponding resonant peak wavelength shifts towards the shorter wavelength side.

The emission spectra and the transmission spectra are measured in the following manner. Specifically, in order to measure an emission spectrum, a section of the organic layer 33 (or more preferably, the light-emitting layer 45) in each of the optical output parts 51r, 51g, 51b is first exposed by etching or cutting using a focused ion beam (FIB). Then, the exposed section is irradiated with ultraviolet light so as to measure a photoluminescence spectrum of light emitted by the light-emitting layer 45 in response to the ultraviolet irradiation. The ultraviolet light is preferably emitted from a xenon lamp, and is most preferably emitted while filtering a wavelength thereof that corresponds to an absorption peak wavelength of the light-emitting layer 45. If such absorption peak wavelength is difficult to determine, the measurement may be implemented by emitting ultraviolet light having a 365-nm wavelength. On the other hand, a transmission spectrum is determined by first measuring the refractive indices (including absorption coefficients) and the layer thicknesses of the materials in each of the optical output parts 51r, 51g, 51b. Then, the transmission spectrum is determined from the measured values on the basis of a common matrix technique.

If it is difficult to measure either the emission spectrum or the transmission spectrum of an optical output part, the optical output part may be turned on to exhibit the maximum brightness. Then, the output spectrum of the optical output part may be measured. By dividing the measured output spectrum by the measurable one of the emission spectrum and the transmission spectrum, the other one of the emission spectrum and the transmission spectrum that was not measurable can be determined.

Figure 12:
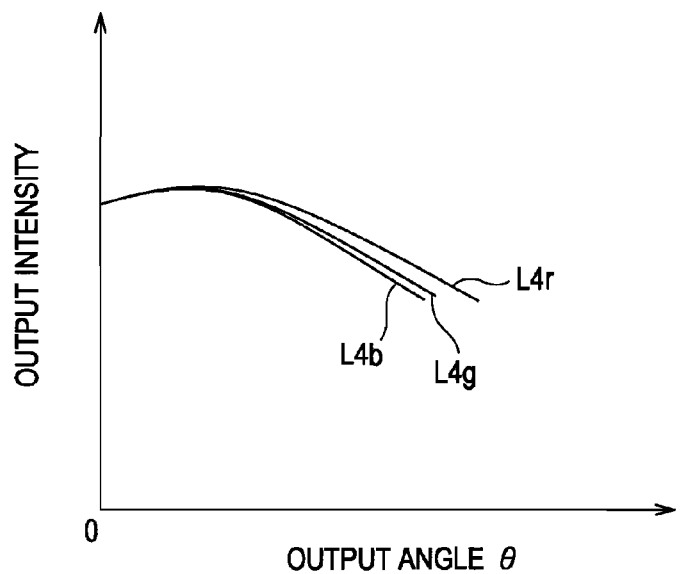
FIG. 12 illustrates relationships between the output angle and the output intensities of the red, green, and blue light rays respectively corresponding to FIGS. 11A to 11C.

FIG. 12 illustrates relationships between the output angle and the output intensities of the red, green, and blue light rays respectively corresponding to FIGS. 11A to 11C. The relationships are illustrated with curves L4r, L4g, and L4b. Referring to FIG. 12, the output intensities for the corresponding colors vary in response to a change in the output angle θ, but the ratio of the output intensities among the colors is maintained substantially constant regardless of the value of the output angle θ. The curves L4r, L4g, and L4b in FIG. 12 have substantially the same variation characteristics within a relatively wide range of the output angle θ. Therefore, the variation characteristics of the output intensities shown in FIG. 12 are suitable for achieving a wide viewing angle without the occurrence of color shifts.

The resonant wavelengths of the resonator structures 9 in the optical output parts 51r, 51g, 51b are preferably set as follows. Specifically, when differences between the emission peak wavelengths λ1r, λ1g, λ1b and the resonant peak wavelengths λ2r, λ2g, λ2b are respectively represented as Δλr, Δλg, Δλb, the resonant wavelength values of the resonator structures 9 in the optical output parts 51r, 51g, 51b are set so as to satisfy the following conditions: $0.5 \leq \Delta\lambda g/\Delta\lambda r \leq 2$ and $0.5 \leq \Delta\lambda b/\Delta\lambda g \leq 2$. If these values exceed the upper limit or fall below the lower limit, even though color shifts can be effectively reduced, the output spectrum values become small, which may lead to an increase in power consumption to maintain appropriate emission brightness.

Color shifting can be further reduced by setting absolute values |Δλ| of the differences between the emission peak wavelengths and the resonant peak wavelengths to larger values for the optical output parts having thicker resonator structures 9. This is based on the fact that the shifting of the resonant wavelengths towards the shorter wavelength side, which is caused when the output angle is changed with respect to the front direction D2, is dependant upon the thickness of the resonator structures 9. Therefore, the thicker the resonator structures 9, the greater the amount of shifting of the resonant wavelengths in response to the same angle change. In the first embodiment, when the thickness of the resonator structures 9 increases in the order: optical output part 51r>optical output part 51g>optical output part 51b, a preferred relationship among the absolute values |Δλr|, |Δλg|, and |Δλb| is as follows: |Δλr|>|Δλg|>|Δλb|.

Practical Example

The following description is directed to a comparison between a comparative example corresponding to a typical electroluminescent device and a specific practical example of the electroluminescent device 21 according to the first embodiment. The comparison between the comparative example and the practical example is implemented while focusing mainly on the resonator-structure elements that are interposed between the electrodes 31 and 35.

Figure 13:
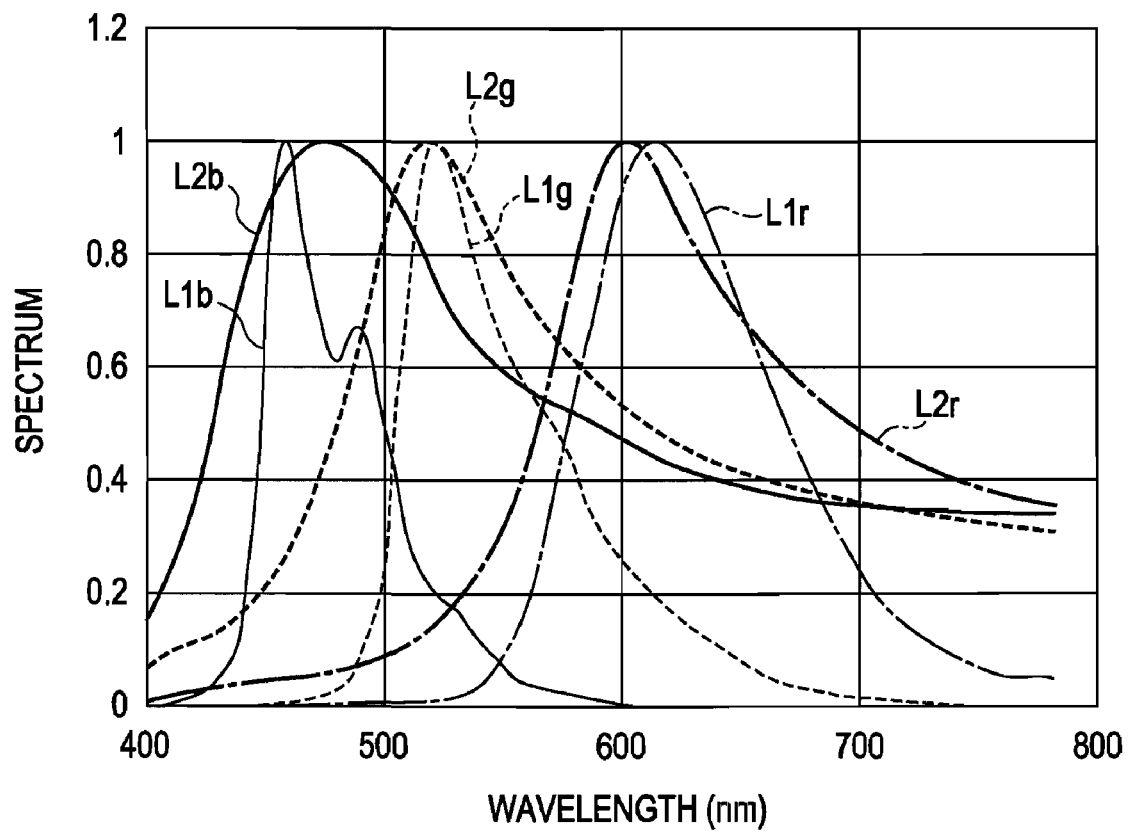
FIG. 13 shows optical simulation results based on a comparative example, and illustrates relationships between emission spectra and transmission spectra of the corresponding colors.

The comparative example has the following configuration.
(a) Hole injection layer 41: Not provided
(b) Hole transport layer 43:
Material: NPB
Thickness: 70 nm (R), 50 nm (G, B)
(c) Light-emitting layer 45:
Host material: $Alq_3$ (R, G), SDPVBi (B)
Host thickness: 60 nm (R), 50 nm (G), 20 nm (B)
Dopant material: DCJTB (R), coumarin (G), styrylamine (B)
(d) Electron transport layer 47: Not provided
(e) Electron injection layer 49:
Material: magnesium
Thickness: 10 nm
(f) Second electrode (cathode) 35
Material: ITO
Thickness: 100 nm FIG. 13 is a graph showing optical simulation results based on the comparative example. The graph shows relationships between emission spectra and transmission spectra, based on the front direction, of the corresponding colors. According to the simulation results shown in FIG. 13, a resonant peak wavelength of a transmission spectrum (L2r) corresponding to red color is on the shorter wavelength side of an emission peak wavelength of an emission spectrum (L1r) corresponding to red color. On the other hand, a resonant peak wavelength of a transmission spectrum (L2g) corresponding to green color substantially coincides with an emission peak wavelength of an emission spectrum (L1g) corresponding to green color. Furthermore, a resonant peak wavelength of a transmission spectrum (L2b) corresponding to blue color is on the longer wavelength side of an emission peak wavelength of an emission spectrum (L1b) corresponding to blue color.

Figure 14:
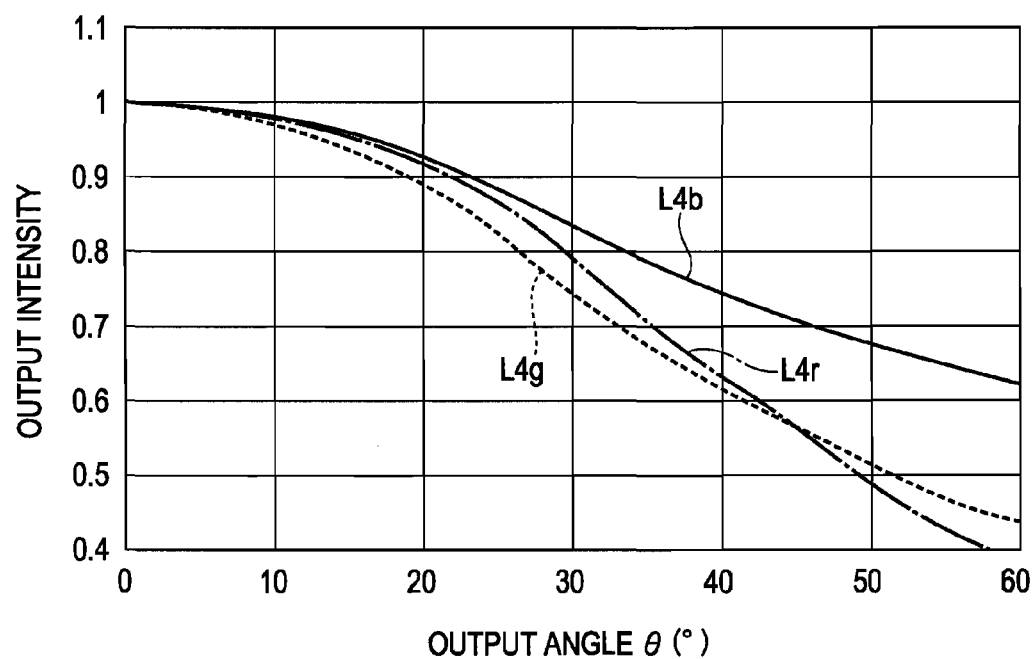
FIG. 14 illustrates optical simulation results based on FIG. 13, and shows relationships between the output angle and the output intensities of red, green, and blue light rays.

FIG. 14 shows optical simulation results based on FIG. 13, and illustrates relationships between the output angle and the output intensities of red, green, and blue light rays. The relationships are illustrated with curves L4r, L4g, and L4b. According to the simulation results shown in FIG. 14, the output intensities of the red and green light rays decrease drastically as the output angle θ increases, as compared with the output intensity of the blue light ray. Thus, the ratios of the output intensities among the colors differ greatly from one another.

Next, the output intensities of the red, green, and blue light rays in the comparative example are set such that the color coordinates of white light are set to D65 (i.e. black-body radiation temperature of 6500 K) based on the front direction D2. Under this condition, a study on the shifting of the white light in response to an increased output angle θ was implemented. In this comparative example, the result Δu'v'=0.026 was obtained after calculating the amount of shifting in the color coordinates of the white light when the output angle θ was 60°.

The practical example of the electroluminescent device 21 according to the first embodiment will now be described. This practical example is directed to an adjustment of the relationships between the emission spectra and the transmission spectra of the first and second optical output parts 51r, 51g in accordance with the relationship between the emission spectrum and the transmission spectrum of the third optical output part 51b in the comparative example.

Figure 15:
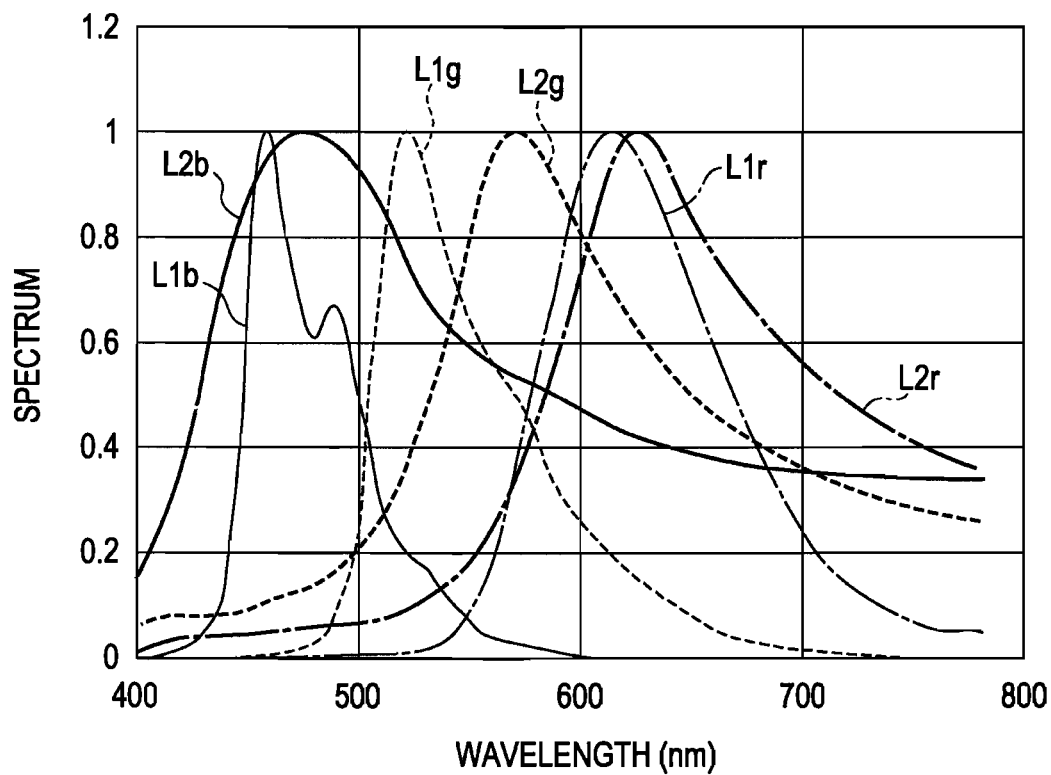
FIG. 15 shows optical simulation results based on a specific practical example of the electroluminescent device according to the first embodiment, and illustrates relationships between emission spectra and transmission spectra of the corresponding colors.

The practical example has the following configuration.
(a) Hole injection layer 41: Not provided
(b) Hole transport layer 43:
Material: NPB
Thickness: 70 nm (R), 50 nm (G, B)
(c) Light-emitting layer 45:
Host material: $Alq_3$ (R, G), SDPVBi (B)
Host thickness: 68 nm (R), 65 nm (G), 20 nm (B)
Dopant material: DCJTB (R), coumarin (G), styrylamine (B)
(d) Electron transport layer 47: Not provided
(e) Electron injection layer 49:
Material: magnesium
Thickness: 10 nm
(f) Second electrode (cathode) 35
Material: ITO
Thickness: 100 nm FIG. 15 is a graph showing optical simulation results based on the practical example. The graph shows relationships between emission spectra and transmission spectra, based on the front direction, of the corresponding colors. According to the simulation results shown in FIG. 15, resonant peak wavelengths of transmission spectra (L2r, L2g, L2b) corresponding to red, green, and blue colors are all on the longer wavelength side of emission peak wavelengths of emission spectra (L1r, L1g, L1b) of the corresponding colors.

Figure 16:
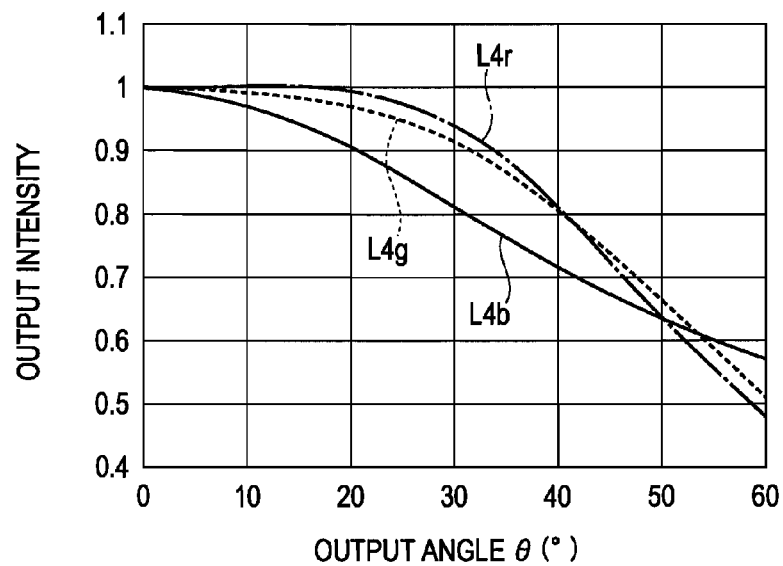
FIG. 16 illustrates optical simulation results based on FIG. 15, and shows relationships between the output angle and the output intensities of red, green, and blue light rays.

FIG. 16 illustrates optical simulation results based on FIG. 15, and shows relationships between the output angle and the output intensities of red, green, and blue light rays. The relationships are illustrated with curves L4r, L4g, and L4b. In contrast to the simulation results shown in FIG. 14 in which the output intensities of the red and green light rays decrease drastically as the output angle θ increases, as compared with the output intensity of the blue light ray, the simulation results in FIG. 16 show that the decreasing rates of the output intensities of the red and green light rays are reduced, as compared with that of the output intensity of the blue light ray. Moreover, the output intensities of the corresponding colors are less different from one another in view of variation characteristics with respect to the output angle θ.

Next, the output intensities of the red, green, and blue light rays in this practical example are set such that the color coordinates of white light are set to D65 (i.e. black-body radiation temperature of 6500 K) based on the front direction D2. Under this condition, a study on the shifting of the white light in response to an increased output angle θ was implemented. In this practical example, the result Δu'v'=0.014 was obtained after calculating the amount of shifting in the color coordinates of the white light when the output angle θ was 60°. Accordingly, this proves that color shifts are more effectively reduced in comparison to the comparative example.

Referring to FIG. 16, in this practical example, the transmission spectra of the corresponding colors are set such that minimum color shifts may occur when the output angle θ is near 0° and 60°. Alternatively, the color-shift prevention may be effected on the basis of an output angle θ different from that in this practical example. This may be achieved by controlling the magnitude relationship of the spectral band widths, and the amount of shifting of the peak wavelengths.

In this practical example, the resonator-structure elements that are taken into consideration are directed only to the elements that are interposed between the electrodes 31 and 35. However, the relationship between the resonant peak wavelength of the resonator structure 9 in each of the first to third optical output parts 51r, 51g, 51b and the emission peak wavelength of the corresponding color is preferably determined in view of all the resonator-structure elements including layers through which the light from the light-emitting layer 45 passes and travels outward, such as the adjustment layer 27 and the sealing film 29.

According to the first embodiment, the resonant peak wavelengths λ2r, λ2g, λ2b of the transmission spectra, which are based on the light rays emitted from the respective first to third optical output parts 51r, 51g, 51b that are transmitted in the front direction D2, are all set on the longer wavelength side of the emission peak wavelengths λ1r, λ1g, λ1b of the emission spectra corresponding to the red, green, and blue light rays emitted by the organic layers 33 included in the optical output parts 51r, 51g, 51b. Therefore, even when the viewing direction of a viewer becomes slanted with respect to the front direction D2, the output intensities of the red, green, and blue light rays change all together as the slanted angle of the viewing direction increases. Accordingly, the occurrence of color shifts in the luminescent colors is suppressed when the viewing direction changes. In particular, the variation characteristics of the output intensities shown in FIG. 12 according to the first embodiment are suitable for achieving a wide viewing angle without the occurrence of color shifts.

Furthermore, by setting the ratio of the difference values Δλr, Δλg, Δλb between the emission peak wavelengths λ1r, λ1g, λ1b corresponding to the red, green, and blue colors in the optical output parts 51r, 51g, 51b and the respective resonant peak wavelengths λ2r, λ2g, λ2b within an optimal range as described above, the occurrence of color shifts in the luminescent colors is further suppressed when the viewing direction changes.

Second Embodiment

The electroluminescent device 21 according to a second embodiment of the present invention is substantially different from the electroluminescent device 21 according to the first embodiment only in that the second embodiment has different setting conditions for the transmission spectra with respect to the emission spectra of the first to third optical output parts 51r, 51g, 51b. Therefore, the main device structure is the same between the first and second embodiments. In the second embodiment, components equivalent to those in the first embodiment are indicated by the same reference numerals, and descriptions of those components will not be repeated.

Figure 17A:
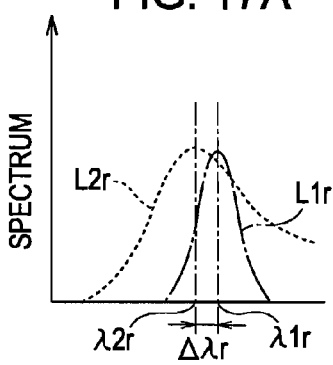
FIGS. 17A to 17C illustrate relationships between emission spectra and transmission spectra of the first to third optical output parts in the electroluminescent device according to a second embodiment of the present invention.
Figure 17B:
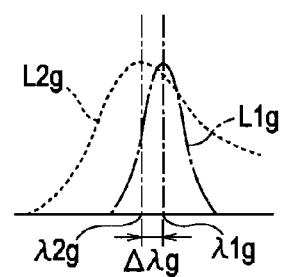
Figure 17C:
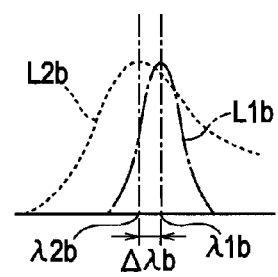

FIGS. 17A to 17C illustrate relationships between emission spectra and transmission spectra of the first to third optical output parts 51r, 51g, 51b in the electroluminescent device 21 according to the second embodiment. In the second embodiment, the resonant peak wavelengths λ2r, λ2g, λ2b of the transmission spectra of the first to third optical output parts 51r, 51g, 51b based on the front direction D2 are all set on the shorter wavelength side of the emission peak wavelengths λ1r, λ1g, λ1b in the emission spectra of the three colors of light rays emitted by the corresponding organic layers 33 included in the optical output parts 51r, 51g, 51b. The resonant peak wavelengths λ2r, λ2g, λ2b are within the visible light range.

Consequently, in the electroluminescent device 21, when the output angle θ changes, the resonant peak wavelengths λ2r, λ2g, λ2b of the first to third optical output parts 51r, 51g, 51b change in substantially the same pattern with respect to the emission peak wavelengths λ1r, λ1g, λ1b. Thus, the output intensities of the light rays of red, green, and blue colors change all together as the output angle θ increases. Accordingly, the ratio of the output intensities among the color light rays is maintained substantially constant even when the output angle θ increases.

Figure 18:
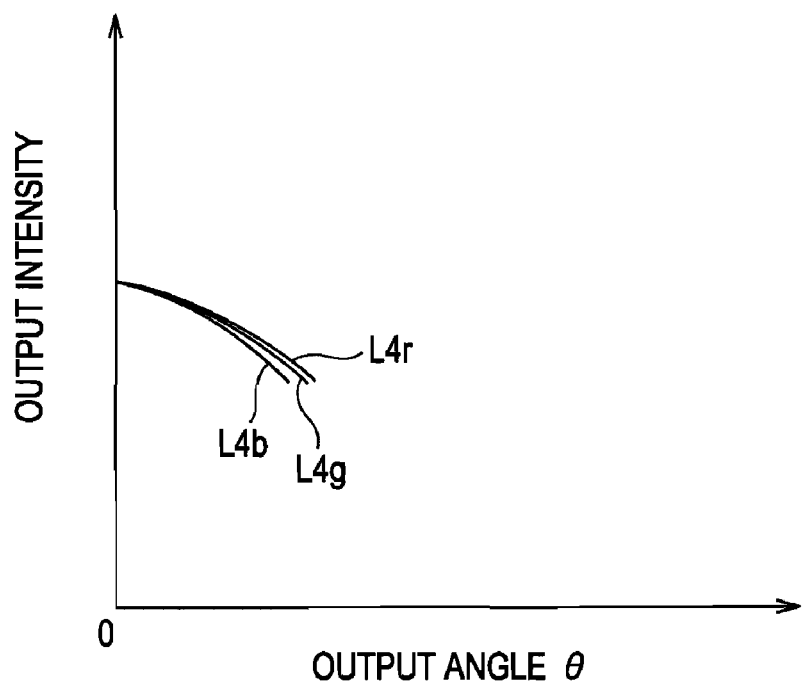
FIG. 18 illustrates relationships between the output angle and the output intensities of red, green, and blue light rays respectively corresponding to FIGS. 17A to 17C.

FIG. 18 illustrates relationships between the output angle and the output intensities of the red, green, and blue light rays respectively corresponding to FIGS. 17A to 17C. The relationships are illustrated with curves L4r, L4g, and L4b. Referring to FIG. 18, the output intensities of the corresponding colors vary in response to a change in the output angle θ, but the ratio of the output intensities among the colors is maintained substantially constant.

Furthermore, when differences between the emission peak wavelengths λ1r, λ1g, λ1b and the resonant peak wavelengths λ2r, λ2g, λ2b are respectively represented as Δλr, Δλg, Δλb, the resonant peak wavelength values of the optical output parts 51r, 51g, 51b are preferably set so as to satisfy the following conditions: $0.5 \leq \Delta\lambda g/\Delta\lambda r \leq 2$ and $0.5 \leq \Delta\lambda b/\Delta\lambda g \leq 2$.

Accordingly, the second embodiment achieves substantially the same advantages as those of the first embodiment. In particular, the variation characteristics of the output intensities shown in FIG. 18 are suitable for achieving highly directional viewing characteristics with less color shifting.

Similar to the first embodiment, color shifting can be further reduced by setting absolute values |Δλ| of the differences between the emission peak wavelengths and the resonant peak wavelengths to larger values for the optical output parts having thicker resonator structures 9. However, in the second embodiment, the resonant peak wavelengths are set on the shorter wavelength side of the emission peak wavelengths, which implies that the emission brightness from the optical output parts is lower than that in the first embodiment. Therefore, the second embodiment is considered to be less effective than the first embodiment.

Third Embodiment

Figure 19:
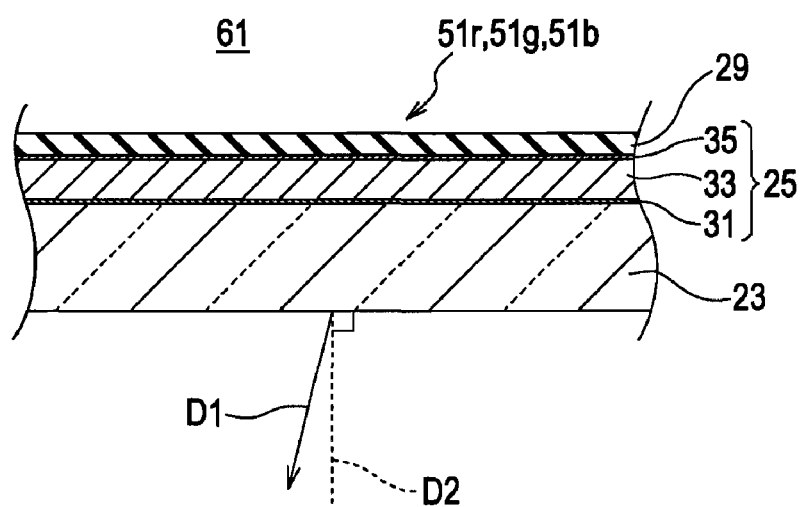
FIG. 19 is a schematic cross-sectional view of an electroluminescent device according to a third embodiment of the present invention.

FIG. 19 is a schematic cross-sectional view of an electroluminescent device 61 according to a third embodiment of the present invention. In FIG. 19, components corresponding to those in FIG. 9 are given the same reference numerals, and descriptions of those components will not be repeated.

As shown in FIG. 19, the electroluminescent device 61 according to the third embodiment is a bottom emission type in which light emitted from each light-emitting layer is transmitted through the glass substrate 23 before being eventually output outward.

Thus, if the resonator structures 9 are to include other elements in addition to those interposed between the electrodes 31 and 35, the additional elements may be layers and components disposed in a region through which the light emitted from the light-emitting layers 45 passes. For example, such additional elements may include the glass substrate 23 itself and a layer not shown in the drawing (such as a planarizing layer) that is interposed between the glass substrate 23 and the element portions 25.

In the third embodiment, the relationships between the emission peak wavelengths of emission spectra of the first to third optical output parts 51r, 51g, 51b and the resonant peak wavelengths of transmission spectra based on the front direction are set in a similar manner as in the first and second embodiments. In other words, the resonant peak wavelengths λ2r, λ2g, λ2b of the transmission spectra in the first to third optical output parts 51r, 51g, 51b based on the front direction D2 are all set on the longer wavelength side or the shorter wavelength side of the emission peak wavelengths λ1r, λ1g, λ1b in the emission spectra of the color light rays emitted by the corresponding organic layers 33 included in the optical output parts 51r, 51g, 51b. The resonant peak wavelengths λ2r, λ2g, λ2b are within the visible light range.

Accordingly, the third embodiment achieves substantially the same advantages as those of the first and second embodiments.

Furthermore, in the third embodiment, the relationships between the resonant peak wavelengths of the resonator structures 9 in the first to third optical output parts 51r, 51g, 51b and the emission peak wavelengths of the corresponding colors are set in view of the resonator-structure elements that additionally include the glass substrate 23. Thus, the occurrence of color shifts in the luminescent colors is further suppressed when the viewing direction changes.

Accordingly, in the first to third embodiments, the resonant wavelengths of the resonator structures in the optical output parts for all three colors are on the longer wavelength side or the shorter wavelength side of the emission peak wavelengths of the color light rays emitted by the corresponding light-emitting layers included in the optical output parts. Therefore, even when the viewing direction of a viewer becomes slanted with respect to the front direction, the output intensities of the corresponding colors change all together as the slanted angle of the viewing direction increases. Accordingly, the occurrence of color shifts in the luminescent colors is further suppressed when the viewing direction changes.

If the electroluminescent device is to be used in an apparatus that requires a relatively wide viewing angle, such as a television, the resonant peak wavelengths are preferably set on the longer wavelength side of the emission peak wavelengths.

In contrast, if the electroluminescent device is to be used in an apparatus that requires a relatively narrow viewing angle, such as a portable phone and a PDA, the resonant peak wavelengths are preferably set on the shorter wavelength side of the emission peak wavelengths. This is due to the following reasons.

Specifically, the resonant peak wavelengths of the transmission spectra shift towards the shorter wavelength side as the viewing direction becomes slanted. Therefore, when the viewing direction becomes slanted in a state where the resonant peak wavelengths are on the shorter wavelength side of the emission peak wavelengths, the output spectra, which are products of the transmission spectra and the emission spectra, decrease due to an increase in difference between the resonant peak wavelengths and the emission peak wavelengths. However, by preliminarily setting the resonant peak wavelengths of the transmission spectra on the longer wavelength side of the emission peak wavelengths of the emission spectra, the resonant peak wavelengths and the emission peak wavelengths shift toward each other while the slanted angle of the viewing direction is relatively small, whereby the output spectra increase. Therefore, even when the slanted angle increases, the decreasing rates of the output spectra are smaller, as compared with a case where the resonant peak wavelengths of the transmission spectra are preliminarily set on the shorter wavelength side of the emission peak wavelengths. Consequently, setting the resonant peak wavelengths of the transmission spectra on the longer wavelength side of the emission peak wavelengths of the emission spectra is advantageous when a wide viewing angle is desired. In contrast, if a narrow viewing angle is desired, it is advantageous to set the resonant peak wavelengths of the transmission spectra on the shorter wavelength side of the emission peak wavelengths of the emission spectra.

Furthermore, according to the first to third embodiments, the differences $\Delta\lambda r$, $\Delta\lambda g$, $\Delta\lambda b$ between the emission peak wavelengths of the color light rays in the optical output parts and the corresponding resonant peak wavelengths are set such that the ratio of the differences $\Delta\lambda r$, $\Delta\lambda g$, $\Delta\lambda b$ satisfies the following conditions: $0.5 \leq \Delta\lambda g/\Delta\lambda r \leq 2$ and $0.5 \leq \Delta\lambda b/\Delta\lambda g \leq 2$. Thus, the occurrence of color shifts in the luminescent colors is further suppressed when the viewing direction changes.

Furthermore, according to the first to third embodiments, the relationships between the resonant peak wavelengths and the emission peak wavelengths of the optical output parts are set in view of the resonant characteristics of the resonator-structure elements interposed between the electrodes, which have a significant effect on the characteristics of the resonator structures. Accordingly, the occurrence of color shifts in the luminescent colors is properly suppressed when the viewing direction changes.

Furthermore, according to the first and second embodiments, the relationships between the resonant peak wavelengths of the resonator structures in the optical output parts and the emission peak wavelengths of the corresponding colors may be set in view of the resonator structure elements additionally including a sealing film. Accordingly, the occurrence of color shifts in the luminescent colors is further suppressed when the viewing direction changes.

Furthermore, according to the third embodiment, the relationships between the resonant peak wavelengths of the resonator structures in the optical output parts and the emission peak wavelengths of the corresponding colors may be determined in view of the resonator-structure elements additionally including a transparent substrate. Accordingly, the occurrence of color shifts in the luminescent colors is further suppressed when the viewing direction changes.

Furthermore, according to the first to third embodiments, the relationships between the resonant peak wavelengths of the resonator structures in the optical output parts and the emission peak wavelengths may be set in view of the condition that the resonator structures include all layers and components through which light emitted from the light-emitting layers passes before being output outward. Accordingly, the occurrence of color shifts in the luminescent colors is further suppressed when the viewing direction changes.

What is claimed is:

1. An electroluminescent device comprising:
    a first optical output part including a light-emitting layer that emits a light ray of a first color and a resonator structure that resonates the light ray of the first color emitted from the light-emitting layer;
    a second optical output part including a light-emitting layer that emits a light ray of a second color and a resonator structure that resonates the light ray of the second color emitted from the light-emitting layer; and
    a third optical output part including a light-emitting layer that emits a light ray of a third color and a resonator structure that resonates the light ray of the third color emitted from the light-emitting layer,
    wherein the first, second, and third colors are different from one another, and
    wherein, in each of the first to third optical output parts, when a peak value of a transmission spectrum of light transmitted through the resonator structure in a direction perpendicular to a main surface of the light-emitting layer is defined as a resonant peak wavelength, the resonant peak wavelength is on a longer wavelength side of an emission peak wavelength indicating a peak value of an emission spectrum of the light ray emitted by the light-emitting layer.

2. The electroluminescent device according to claim 1, wherein the resonant peak wavelength of each of the first to third optical output parts is within a visible light range.

3. The electroluminescent device according to claim 1, wherein the first, second, and third colors are red, green, and blue colors, respectively.

4. The electroluminescent device according to claim 3, wherein when differences between the emission peak wavelengths of the light rays emitted by the first to third optical output parts and the corresponding resonant peak wavelengths are represented as $\Delta\lambda r$, $\Delta\lambda g$, $\Delta\lambda b$, the following conditions are satisfied:

$$0.5 \leq \Delta\lambda g/\Delta\lambda r \leq 2, \text{ and}$$

$$0.5 \leq \Delta\lambda b/\Delta\lambda g \leq 2.$$

5. The electroluminescent device according to claim 1, wherein the resonator structure in each of the first to third optical output parts includes one or more layers interposed between a pair of electrodes that are disposed on opposite sides of the corresponding light-emitting layer in a thickness direction thereof.

6. The electroluminescent device according to claim 1, further comprising a substrate on which the first to third optical output parts are disposed; and a sealing film which covers the first to third optical output parts and transmits the light rays emitted from the first to third optical output parts,
    wherein the sealing film is included in the resonator structures of the optical output parts.

7. The electroluminescent device according to claim 1, further comprising a transparent substrate on which the first to third optical output parts are disposed, the transparent substrate transmitting the light rays emitted from the first to third optical output parts,
    wherein the transparent substrate is included in the resonator structures of the optical output parts.

8. The electroluminescent device according to claim 1, wherein the resonator structures in the first to third optical output parts include all layers and components through which the light rays emitted from the first to third optical output parts are transmitted before being output outward.

9. The electroluminescent device according to claim 1, wherein absolute values of differences between the emission peak wavelengths of the light rays emitted from the first to third optical output parts and the corresponding resonant peak wavelengths are set to larger values for the optical output parts having the resonator structures with larger thicknesses.

10. An electroluminescent device comprising:
    a first optical output part including a light-emitting layer that emits a light ray of a first color and a resonator structure that resonates the light ray of the first color emitted from the light-emitting layer;

a second optical output part including a light-emitting layer that emits a light ray of a second color and a resonator structure that resonates the light ray of the second color emitted from the light-emitting layer; and a third optical output part including a light-emitting layer that emits a light ray of a third color and a resonator structure that resonates the light ray of the third color emitted from the light-emitting layer, wherein the first, second, and third colors are different from one another, and wherein, in each of the first to third optical output parts, when a peak value of a transmission spectrum of light transmitted through the resonator structure in a direction perpendicular to a main surface of the light-emitting layer is defined as a resonant peak wavelength, the resonant peak wavelength is on a shorter wavelength side of an emission peak wavelength indicating a peak value of an emission spectrum of the light ray emitted by the light-emitting layer.

11. The electroluminescent device according to claim 10, wherein the resonant peak wavelength of each of the first to third optical output parts is within a visible light range.

12. The electroluminescent device according to claim 10, wherein the first, second, and third colors are red, green, and blue colors, respectively.

13. The electroluminescent device according to claim 12, wherein when differences between the emission peak wavelengths of the light rays emitted by the first to third optical output parts and the corresponding resonant peak wavelengths are represented as $\Delta\lambda r$, $\Delta\lambda g$, $\Delta\lambda b$, the following conditions are satisfied:

$0.5 \leq \Delta\lambda g/\Delta\lambda r \leq 2$, and $0.5 \leq \Delta\lambda b/\Delta\lambda g \leq 2$.

14. The electroluminescent device according to claim 10, wherein the resonator structure in each of the first to third optical output parts includes one or more layers interposed between a pair of electrodes that are disposed on opposite sides of the corresponding light-emitting layer in a thickness direction thereof.

15. The electroluminescent device according to claim 10, further comprising a substrate on which the first to third optical output parts are disposed; and a sealing film which covers the first to third optical output parts and transmits the light rays emitted from the first to third optical output parts, wherein the sealing film is included in the resonator structures of the optical output parts.

16. The electroluminescent device according to claim 10, further comprising a transparent substrate on which the first to third optical output parts are disposed, the transparent substrate transmitting the light rays emitted from the first to third optical output parts, wherein the transparent substrate is included in the resonator structures of the optical output parts.

17. The electroluminescent device according to claim 10, wherein the resonator structures in the first to third optical output parts include all layers and components through which the light rays emitted from the first to third optical output parts is transmitted before being output outward.

18. The electroluminescent device according to claim 10, wherein absolute values of differences between the emission peak wavelengths of the light rays emitted from the first to third optical output parts and the corresponding resonant peak wavelengths are set to larger values for the optical output parts having the resonator structures with larger thicknesses.

* * * * *